(12) United States Patent
Dewey et al.

(10) Patent No.: US 8,536,621 B2
(45) Date of Patent: Sep. 17, 2013

(54) QUANTUM-WELL-BASED SEMICONDUCTOR DEVICES

(75) Inventors: Gilbert Dewey, Hillsboro, OR (US); Marko Radosavljevic, Beaverton, OR (US); Ravi Pillarisetty, Portland, OR (US); Robert S. Chau, Beaverton, OR (US); Matthew V. Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/571,121

(22) Filed: Aug. 9, 2012

(65) Prior Publication Data

US 2012/0298958 A1    Nov. 29, 2012

Related U.S. Application Data (62) Division of application No. 12/632,498, filed on Dec. 7, 2009, now Pat. No. 8,258,543.

(51) Int. Cl.
*H01L 29/66* (2006.01)
(52) U.S. Cl.
USPC ............. 257/192; 257/24; 257/193; 257/194; 257/195; 257/200; 257/615; 257/616; 438/962; 438/933
(58) Field of Classification Search
USPC ................... 257/24, 192–195, 200, 615, 616, 257/E29.14, E29.248, E21.189, E21.371, 257/E21.387, E21.403, E21.407, E21.449, 257/E31.019, E29.089, 933
See application file for complete search history.

(56) References Cited

U.S. PATENT DOCUMENTS

| | | | |
|---|---|---|---|
| 5,986,291 A | 11/1999 | Currie et al. | |
| 6,191,432 B1 | 2/2001 | Sugiyama et al. | |
| 7,989,280 B2 | 8/2011 | Brask et al. | |
| 2004/0201037 A1 | 10/2004 | Fareed et al. | |
| 2008/0191196 A1 | 8/2008 | Lu et al. | |
| 2008/0203430 A1 | 8/2008 | Simin et al. | |
| 2008/0227246 A1 | 9/2008 | Chiu et al. | |
| 2010/0276668 A1* | 11/2010 | Ko et al. ................ | 257/24 |

FOREIGN PATENT DOCUMENTS

KR    100566255    3/2006

OTHER PUBLICATIONS

Chen, et al., "Metalorganic chemical vapor deposition of indium phosphide by pulsing precursors," Appl. Phys. Lett. 55 (10), Sep. 4, 1989, pp. 987-989 3 pgs.
International Search Report and Written Opinion from PCT/US2010/053218 mailed Jun. 21, 2011, 9 pgs.
International Preliminary Report on Patentability from PCT/US2010/053218 mailed Jun. 21, 2012.
Non-Final Office Action from Rafai12/632,498 mailed Dec. 21, 2011, 9 pgs.

* cited by examiner

*Primary Examiner* — Steven Loke
*Assistant Examiner* — Cuong B Nguyen
(74) *Attorney, Agent, or Firm* — Blakely, Sokoloff, Taylor & Zafman LLP (57) ABSTRACT

Quantum-well-based semiconductor devices and methods of forming quantum-well-based semiconductor devices are described. A method includes providing a hetero-structure disposed above a substrate and including a quantum-well channel region. The method also includes forming a source and drain material region above the quantum-well channel region. The method also includes forming a trench in the source and drain material region to provide a source region separated from a drain region. The method also includes forming a gate dielectric layer in the trench, between the source and drain regions; and forming a gate electrode in the trench, above the gate dielectric layer.

9 Claims, 5 Drawing Sheets

QUANTUM-WELL-BASED SEMICONDUCTOR DEVICES

CROSS-REFERENCE TO RELATED APPLICATIONS

This application is a divisional of U.S. patent application Ser. No. 12/632,498, filed Dec. 7, 2009, the entire contents of which are hereby incorporated by reference herein.

TECHNICAL FIELD

Embodiments of the invention are in the field of Semiconductor Devices and, in particular, quantum-well-based semiconductor devices and methods of forming quantum-well-based semiconductor devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Quantum-well devices formed in epitaxially grown semiconductor hetero-structures, such as in III-V material systems, offer exceptionally high carrier mobility in the transistor channels due to low effective mass along with reduced impurity scattering by delta doping. These devices provide high drive current performance and appear promising for future low power, high speed logic applications.

DETAILED DESCRIPTION

Quantum-well-based semiconductor devices and methods of forming quantum-well-based semiconductor devices are described. In the following description, numerous specific details are set forth, such as material regimes and device characteristics, in order to provide a thorough understanding of embodiments of the present invention. It will be apparent to one skilled in the art that embodiments of the present invention may be practiced without these specific details. In other instances, well-known features, such as patterning processes, are not described in detail in order to not unnecessarily obscure embodiments of the present invention. Furthermore, it is to be understood that the various embodiments shown in the Figures are illustrative representations and are not necessarily drawn to scale.

Disclosed herein are quantum-well-based semiconductor devices. In one embodiment, a quantum-well-based semiconductor device includes a hetero-structure disposed above a substrate and having a quantum-well channel region. A source and drain material region is disposed above the quantum-well channel region. A trench is disposed in the source and drain material region separating a source region from a drain region. A barrier layer is disposed in the trench, between the source and drain regions. A gate dielectric layer is disposed in the trench, above the barrier layer. A gate electrode is disposed in the trench, above the gate dielectric layer. In one embodiment, a quantum-well-based semiconductor device includes a hetero-structure disposed above a substrate and having a quantum-well channel region. A barrier layer is disposed directly on the quantum-well channel region. A source and drain material region is disposed above the barrier layer. A trench is disposed in the source and drain material region separating a source region from a drain region. A gate dielectric layer is disposed in the trench, between the source and drain regions. A gate electrode is disposed in the trench, above the gate dielectric layer.

Also disclosed herein are methods of forming quantum-well-based semiconductor devices. In one embodiment, a method includes providing a hetero-structure disposed above a substrate and including a quantum-well channel region. A source and drain material region is formed above the quantum-well channel region. A trench is formed in the source and drain material region to provide a source region separated from a drain region. A gate dielectric layer is formed in the trench, between the source and drain regions. A gate electrode is formed in the trench, above the gate dielectric layer.

In accordance with an embodiment of the present invention, a gate-last flow is used to fabricate group III-V or germanium quantum-well field effect transistor (QWFET) devices. This approach may enable one or more of the following features: (1) all materials including source and drain material are grown first and then a trench is etched in the source and drain material to accommodate a gate electrode, (2) source and drain growth is simplified because regrowth is no longer required and the possible elimination of a barrier between a quantum well and a doped source and drain may be realized, (3) a high band gap barrier material and a high K gate dielectric may be deposited later in the process flow and may be deposited by atomic layer deposition (ALD) or metal-organic chemical vapor deposition (MO-CVD), and (4) a gate-last flow may enable the lowest thermal budget to be applied to the gate material or enable a more precise control on that operation since the operation is last in that portion of the processing scheme.

In various embodiments presented herein, key features may include an etch of a gate trench, deposition of gate material by ALD or MOCVD, and an overall reduction in external resistance (Rext) since, in some embodiments, there is no barrier in the source and drain region and the source and drain region is a highly doped group III-V or germanium material. In an embodiment, approaches described herein enable avoidance of the formation of dislocations and impurities in the source and drain regions that might otherwise occur if the source and drain regions were regrown after an etch process. In one embodiment, some of the approaches described herein enable deposition of a barrier material at the end-of line processing in the process flow, reducing detrimental thermal impact of a gate electrode material. In one embodiment, some of the approaches described herein enable the formation of a barrier layer only under a gate stack region, between the gate stack and a quantum well, and not between source/drain regions and the quantum well. In accordance with an embodiment of the present invention, one or more of the gate-last approaches described herein enables the use of a barrier material that would otherwise deteriorate above approximately 500 degrees Celsius, e.g., would otherwise deteriorate at a temperature required for a source and drain anneal process.

Figure 1:
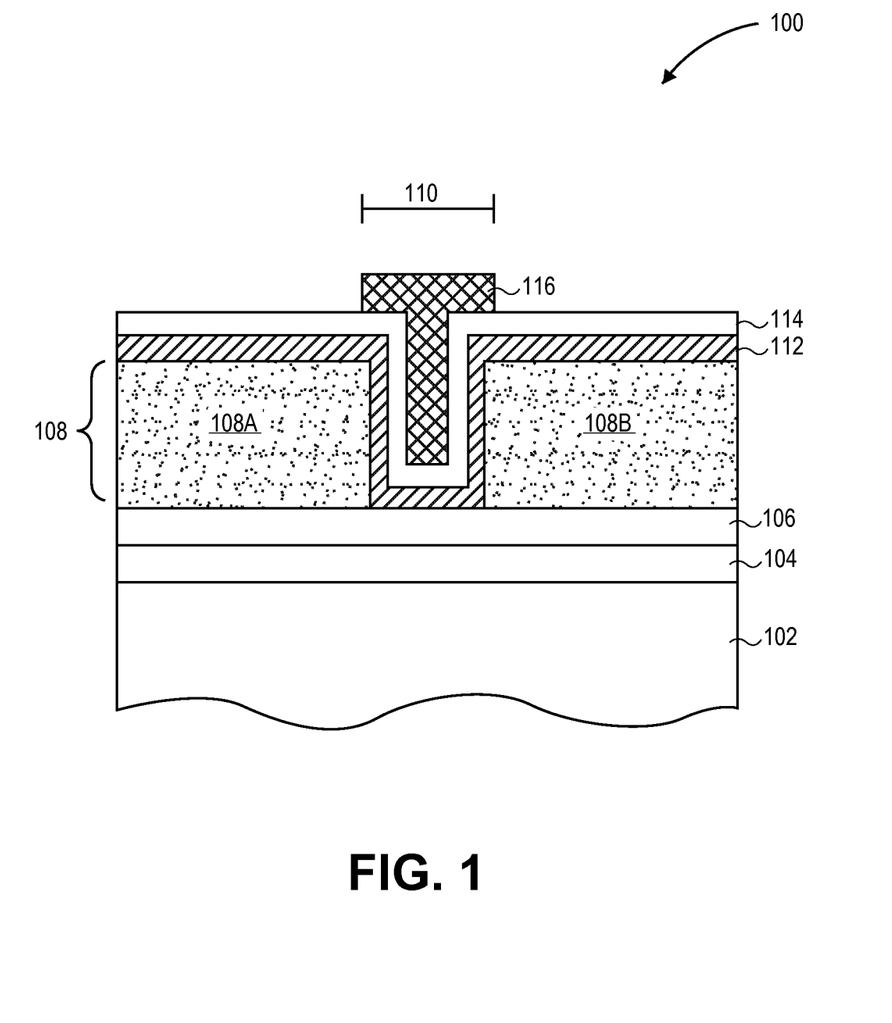
FIG. 1 illustrates a cross-sectional view of a quantum-well-based semiconductor device, in accordance with an embodiment of the present invention.

In an aspect of the present invention, a semiconductor device includes a quantum-well channel region with a barrier layer covering only a portion of the quantum-well channel region. FIG. 1 illustrates a cross-sectional view of a quantum-well-based semiconductor device, in accordance with an embodiment of the present invention.

Referring to FIG. 1, a quantum-well-based semiconductor device 100 includes a hetero-structure 104 disposed above a substrate 102 and including a quantum-well channel region 106. A source and drain material region 108 is disposed above quantum-well channel region 106. A trench 110 is disposed in source and drain material region 108 separating a source region 108A from a drain region 108B. A barrier layer 112 is disposed in trench 110, between source and drain regions 108A and 108B. A gate dielectric layer 114 is disposed in trench 110, above barrier layer 112. A gate electrode 116 is disposed in trench 110, above gate dielectric layer 114. In accordance with an embodiment of the present invention, hetero-structure 104 may be defined as a stack of one or more crystalline semiconductor layers, such as the stack depicted in FIG. 1.

In an embodiment, trench 110 exposes the top surface of the quantum-well channel region 106, and barrier layer 112 is disposed directly on the exposed surface of quantum-well channel region 106, as depicted in FIG. 1. In another embodiment, however, source and drain material region 108 is disposed directly on quantum-well channel region 106 (as depicted), trench 110 is disposed only partially into source and drain material region 108 leaving a portion of source and drain material region 108 at the bottom of trench 110 (not depicted), and barrier layer 112 is disposed directly on the portion of source and drain material region 108 at the bottom of trench 110 (not depicted). In an embodiment, quantum-well channel region 106 includes a group III-V material, and source and drain material region 108 includes a doped group III-V material region. In an embodiment, gate dielectric layer 114 is composed of a high-K material such as, but not limited to, aluminum oxide ($Al_2O_3$) or hafnium oxide ($HfO_2$). In an embodiment, gate electrode 116 is a metal gate electrode. In one embodiment, quantum-well channel region 106 includes a group III-V material, and source and drain material region 108 includes a doped group III-V material region, gate dielectric layer 114 is composed of a high-K material such as, but not limited to, aluminum oxide ($Al_2O_3$) or hafnium oxide ($HfO_2$), and gate electrode 116 is a metal gate electrode.

Substrate 102 may be composed of a material suitable for semiconductor device fabrication. In one embodiment, substrate 102 is a bulk substrate composed of a single crystal of a material which may include, but is not limited to, silicon, germanium, silicon-germanium or a III-V compound semiconductor material. In another embodiment, substrate 102 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 102 includes a top epitaxial layer on a middle insulator layer which is above a lower bulk layer. The top epitaxial layer is composed of a single crystal layer which may include, but is not limited to, silicon (e.g., to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 102 may further include dopant impurity atoms.

Hetero-structure 104 may be defined as a stack of one or more crystalline semiconductor layers, such as a compositional buffer layer with a bottom barrier layer disposed thereon. The compositional buffer layer may be composed of a crystalline material suitable to provide a specific lattice structure onto which a bottom barrier layer may be formed with negligible dislocations. For example, in accordance with an embodiment of the present invention, the compositional buffer layer is used to change, by a gradient of lattice constants, the exposed growth surface of semiconductor hetero-structure 104 from the lattice structure of substrate 102 to one that is more compatible for epitaxial growth of high quality, low defect layers thereon. In one embodiment, the compositional buffer layer acts to provide a more suitable lattice constant for epitxial growth instead of an incompatible lattice constant of substrate 102. In an embodiment, substrate 102 is composed of single-crystal silicon and the compositional buffer layer 104 is composed of a layer of InAlAs having a thickness of approximately 1 micron. In an alternative embodiment, the compositional buffer layer is omitted because the lattice constant of substrate 102 is suitable for the growth of a bottom barrier layer for a quantum-well semiconductor device.

The bottom barrier layer may be composed of a material suitable to confine a wave-function in a quantum-well formed thereon. In accordance with an embodiment of the present invention, the bottom barrier layer has a lattice constant suitably matched to the top lattice constant of the compositional buffer layer, e.g., the lattice constants are similar enough that dislocation formation in the bottom barrier layer is negligible. In one embodiment, the bottom barrier layer is composed of a layer of approximately $In_{0.65}Al_{0.35}As$ having a thickness of approximately 10 nanometers. In a specific embodiment, the bottom barrier layer composed of the layer of approximately $In_{0.65}Al_{0.35}As$ is used for quantum confinement in an N-type semiconductor device. In another embodiment, the bottom barrier layer is composed of a layer of approximately $In_{0.65}Al_{0.35}Sb$ having a thickness of approximately 10 nanometers. In a specific embodiment, the bottom barrier layer composed of the layer of approximately $In_{0.65}Al_{0.35}Sb$ is used for quantum confinement in a P-type semiconductor device.

Quantum-well channel region 106 may be composed of a material suitable to propagate a wave-function with low resistance. In accordance with an embodiment of the present invention, quantum-well channel region 106 has a lattice constant suitably matched to the lattice constant of the bottom barrier layer of hetero-structure 104, e.g., the lattice constants are similar enough that dislocation formation in quantum-well channel region 106 is negligible. In an embodiment, quantum-well channel region 106 is composed of groups III (e.g. boron, aluminum, gallium or indium) and V (e.g. nitrogen, phosphorous, arsenic or antimony) elements. In one embodiment, quantum-well channel region 106 is composed of InAs or InSb. Quantum-well channel region 106 may have a thickness suitable to propagate a substantial portion of a wave-function, e.g. suitable to inhibit a significant portion of the wave-function from entering the bottom barrier layer of hetero-structure 104 or a top barrier layer (e.g., barrier layer 112) formed on quantum-well channel region 106. In an embodiment, quantum-well channel region 106 has a thickness approximately in the range of 150-200 nanometers. In an alternative embodiment, quantum-well channel region 106 is composed of a semiconductor material such as, but not limited to, a silicon-germanium semiconductor material or a II-VI semiconductor material. In another alternative embodiment, quantum-well channel region 106 is a strained quantum-well region having a thickness approximately in the range of 50-100 Angstroms.

Barrier layer 112 may be composed of a material suitable to confine a wave-function in a quantum-well formed thereunder. In accordance with an embodiment of the present invention, barrier layer 112 has a lattice constant suitably matched to the lattice constant of quantum-well channel region 106, e.g., the lattice constants are similar enough that dislocation formation in barrier layer 112 is negligible. In one embodiment, barrier layer 112 is composed of a layer of material such as, but not limited to, indium phosphide (InP), gallium nitride (GaN), or indium gallium phosphide (InGaP). In one embodiment, barrier layer 112 has a thickness approximately in the range of 1-3 nanometers.

Figure 2:
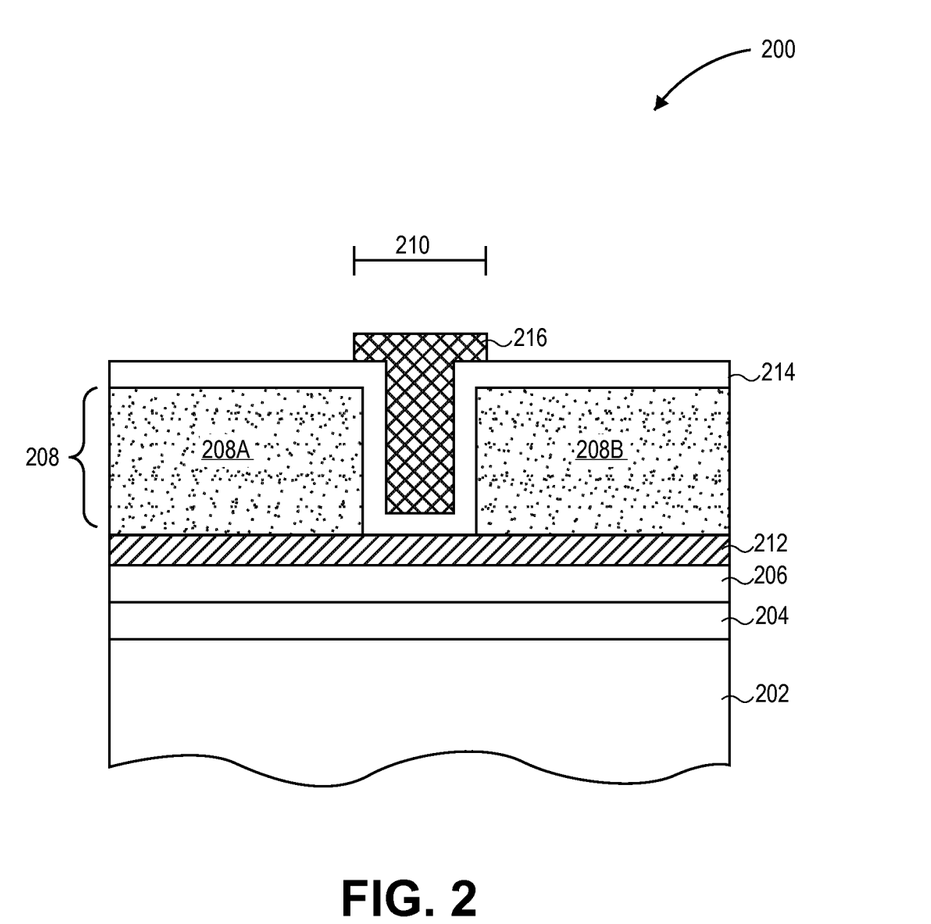
FIG. 2 illustrates a cross-sectional view of a quantum-well-based semiconductor device, in accordance with an embodiment of the present invention.

In another aspect of the present invention, a semiconductor device includes a quantum-well channel region with a barrier layer covering the entire quantum-well channel region. FIG. 2 illustrates a cross-sectional view of a quantum-well-based semiconductor device, in accordance with an embodiment of the present invention.

Referring to FIG. 2, a quantum-well-based semiconductor device 200 includes a hetero-structure 204 disposed above a substrate 202 and including a quantum-well channel region 206. A barrier layer 212 is disposed directly on quantum-well channel region 206. A source and drain material region 208 is disposed above barrier layer 212. A trench 210 is disposed in source and drain material region 208 separating a source region 208A from a drain region 208B. A gate dielectric layer 214 is disposed in trench 210, between source and drain regions 208A and 208B. A gate electrode 216 is disposed in trench 210, above gate dielectric layer 214. In accordance with an embodiment of the present invention, hetero-structure 204 may be defined as a stack of one or more crystalline semiconductor layers, such as the stack depicted in FIG. 2.

In an embodiment, trench 210 exposes the top surface of barrier layer 212, and gate dielectric layer 214 is disposed directly on the exposed surface of barrier layer 212, as depicted in FIG. 2. In another embodiment, however, source and drain material region 208 is disposed directly on barrier layer 212 (as is depicted), trench 210 is disposed only partially into source and drain material region 208 leaving a portion of source and drain material region 208 at the bottom of trench 210 (not depicted), and gate dielectric layer 214 is disposed directly on the portion of source and drain material region 208 at the bottom of trench 210 (not depicted). In an embodiment, quantum-well channel region 206 includes a group III-V material, and source and drain material region 208 includes a doped group III-V material region. In an embodiment, gate dielectric layer 214 is composed of a high-K material such as, but not limited to, aluminum oxide ($Al_2O_3$) or hafnium oxide ($HfO_2$). In an embodiment, gate electrode 216 is a metal gate electrode. In one embodiment, quantum-well channel region 206 includes a group III-V material, and source and drain material region 208 includes a doped group III-V material region, gate dielectric layer 214 is composed of a high-K material such as, but not limited to, aluminum oxide ($Al_2O_3$) or hafnium oxide ($HfO_2$), and gate electrode 216 is a metal gate electrode.

Substrate 202 may be composed of a material suitable for semiconductor device fabrication. In one embodiment, substrate 202 is a bulk substrate composed of a single crystal of a material which may include, but is not limited to, silicon, germanium, silicon-germanium or a III-V compound semiconductor material. In another embodiment, substrate 202 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 202 includes a top epitaxial layer on a middle insulator layer which is above a lower bulk layer. The top epitaxial layer is composed of a single crystal layer which may include, but is not limited to, silicon (e.g., to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 202 may further include dopant impurity atoms.

Hetero-structure 204 may be defined as a stack of one or more crystalline semiconductor layers, such as a compositional buffer layer with a bottom barrier layer disposed thereon. The compositional buffer layer may be composed of a crystalline material suitable to provide a specific lattice structure onto which a bottom barrier layer may be formed with negligible dislocations. For example, in accordance with an embodiment of the present invention, the compositional buffer layer is used to change, by a gradient of lattice constants, the exposed growth surface of semiconductor hetero-structure 204 from the lattice structure of substrate 202 to one that is more compatible for epitaxial growth of high quality, low defect layers thereon. In one embodiment, the compositional buffer layer acts to provide a more suitable lattice constant for epitaxial growth instead of an incompatible lattice constant of substrate 202. In an embodiment, substrate 202 is composed of single-crystal silicon and the compositional buffer layer 204 is composed of a layer of InAlAs having a thickness of approximately 1 micron. In an alternative embodiment, the compositional buffer layer is omitted because the lattice constant of substrate 202 is suitable for the growth of a bottom barrier layer for a quantum-well semiconductor device.

The bottom barrier layer may be composed of a material suitable to confine a wave-function in a quantum-well formed thereon. In accordance with an embodiment of the present invention, the bottom barrier layer has a lattice constant suitably matched to the top lattice constant of the compositional buffer layer, e.g., the lattice constants are similar enough that dislocation formation in the bottom barrier layer is negligible. In one embodiment, the bottom barrier layer is composed of a layer of approximately $In_{0.65}Al_{0.35}As$ having a thickness of approximately 10 nanometers. In a specific embodiment, the bottom barrier layer composed of the layer of approximately $In_{0.65}Al_{0.35}As$ is used for quantum confinement in an N-type semiconductor device. In another embodiment, the bottom barrier layer is composed of a layer of approximately $In_{0.65}Al_{0.35}Sb$ having a thickness of approximately 10 nanometers. In a specific embodiment, the bottom barrier layer composed of the layer of approximately $In_{0.65}Al_{0.35}Sb$ is used for quantum confinement in a P-type semiconductor device.

Quantum-well channel region 206 may be composed of a material suitable to propagate a wave-function with low resistance. In accordance with an embodiment of the present invention, quantum-well channel region 206 has a lattice constant suitably matched to the lattice constant of the bottom barrier layer of hetero-structure 204, e.g., the lattice constants are similar enough that dislocation formation in quantum-well channel region 206 is negligible. In an embodiment, quantum-well channel region 206 is composed of groups III (e.g. boron, aluminum, gallium or indium) and V (e.g. nitrogen, phosphorous, arsenic or antimony) elements. In one embodiment, quantum-well channel region 206 is composed of InAs or InSb. Quantum-well channel region 206 may have a thickness suitable to propagate a substantial portion of a wave-function, e.g. suitable to inhibit a significant portion of the wave-function from entering the bottom barrier layer of hetero-structure 204 or a top barrier layer (e.g., barrier layer 212) formed on quantum-well channel region 206. In an embodiment, quantum-well channel region 206 has a thickness approximately in the range of 150-200 nanometers. In an alternative embodiment, quantum-well channel region 206 is composed of a semiconductor material such as, but not limited to, a silicon-germanium semiconductor material or a II-VI semiconductor material. In another alternative embodiment, quantum-well channel region 206 is a strained quantum-well region having a thickness approximately in the range of 50-100 Angstroms.

Barrier layer 212 may be composed of a material suitable to confine a wave-function in a quantum-well formed thereunder. In accordance with an embodiment of the present invention, barrier layer 212 has a lattice constant suitably matched to the lattice constant of quantum-well channel region 206, e.g., the lattice constants are similar enough that dislocation formation in barrier layer 212 is negligible. In one embodiment, barrier layer 212 is composed of a layer of material such as, but not limited to, indium phosphide (InP), gallium nitride (GaN), or indium gallium phosphide (InGaP). In one embodiment, barrier layer 212 has a thickness approximately in the range of 1-3 nanometers.

Figure 3:
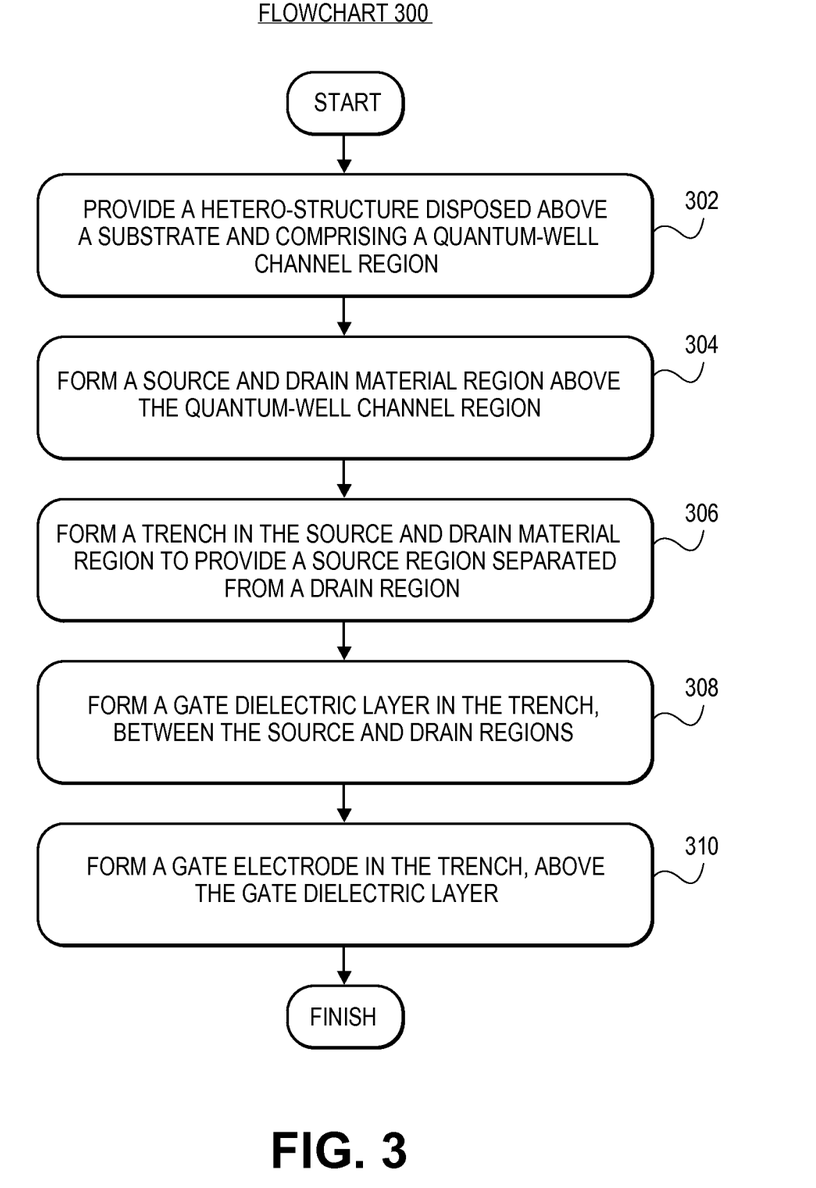
FIG. 3 is a Flowchart representing operations in the fabrication of a quantum-well-based semiconductor device, in accordance with an embodiment of the present invention.

In another aspect of the present invention, method of forming a quantum-well-based semiconductor device includes a gate-last or replacement gate approach. FIG. 3 is a Flowchart 400 representing operations in the fabrication of a quantum-well-based semiconductor device, in accordance with an embodiment of the present invention. FIGS. 4A-4F illustrate cross-sectional views representing operations in the fabrication of a quantum-well-based semiconductor device, in accordance with an embodiment of the present invention.

Figure 4A:
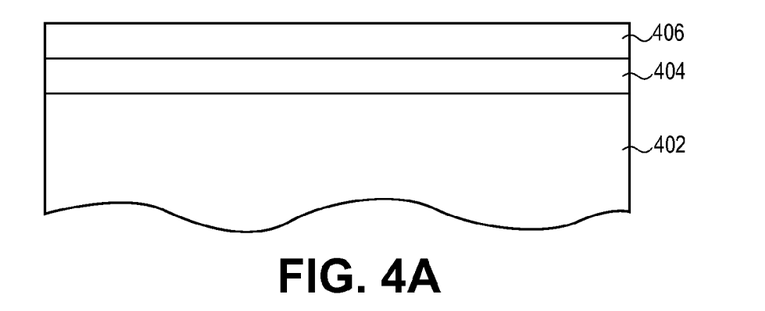
FIG. 4A illustrates a cross-sectional view representing an operation in the fabrication of a quantum-well-based semiconductor device, in accordance with an embodiment of the present invention.

Referring to operation 302 of Flowchart 300 and corresponding FIG. 4A, a method of forming a quantum-well-based semiconductor device includes providing a hetero-structure 404 disposed above a substrate 402 and including a quantum-well channel region 406.

Substrate 402 may be composed of a material suitable for semiconductor device fabrication. In one embodiment, substrate 402 is a bulk substrate composed of a single crystal of a material which may include, but is not limited to, silicon, germanium, silicon-germanium or a III-V compound semiconductor material. In another embodiment, substrate 402 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 402 includes a top epitaxial layer on a middle insulator layer which is above a lower bulk layer. The top epitaxial layer is composed of a single crystal layer which may include, but is not limited to, silicon (e.g., to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 402 may further include dopant impurity atoms.

Hetero-structure 404 may be defined as a stack of one or more crystalline semiconductor layers, such as a compositional buffer layer with a bottom barrier layer disposed thereon. The compositional buffer layer may be composed of a crystalline material suitable to provide a specific lattice structure onto which a bottom barrier layer may be formed with negligible dislocations. For example, in accordance with an embodiment of the present invention, the compositional buffer layer is used to change, by a gradient of lattice constants, the exposed growth surface of semiconductor hetero-structure 404 from the lattice structure of substrate 402 to one that is more compatible for epitaxial growth of high quality, low defect layers thereon. In one embodiment, the compositional buffer layer acts to provide a more suitable lattice constant for epitaxial growth instead of an incompatible lattice constant of substrate 402. In an embodiment, substrate 402 is composed of single-crystal silicon and the compositional buffer layer 404 is composed of a layer of InAlAs having a thickness of approximately 1 micron. In an alternative embodiment, the compositional buffer layer is omitted because the lattice constant of substrate 402 is suitable for the growth of a bottom barrier layer for a quantum-well semiconductor device.

The bottom barrier layer may be composed of a material suitable to confine a wave-function in a quantum-well formed thereon. In accordance with an embodiment of the present invention, the bottom barrier layer has a lattice constant suitably matched to the top lattice constant of the compositional buffer layer, e.g., the lattice constants are similar enough that dislocation formation in the bottom barrier layer is negligible. In one embodiment, the bottom barrier layer is composed of a layer of approximately $In_{0.65}Al_{0.35}As$ having a thickness of approximately 10 nanometers. In a specific embodiment, the bottom barrier layer composed of the layer of approximately $In_{0.65}Al_{0.35}As$ is used for quantum confinement in an N-type semiconductor device. In another embodiment, the bottom barrier layer is composed of a layer of approximately $In_{0.65}Al_{0.35}Sb$ having a thickness of approximately 10 nanometers. In a specific embodiment, the bottom barrier layer composed of the layer of approximately $In_{0.65}Al_{0.35}Sb$ is used for quantum confinement in a P-type semiconductor device. In accordance with an embodiment of the present invention, the compositional buffer layer and the bottom barrier layer are deposited by a molecular-beam epitaxy technique performed on the surface of substrate 402.

Quantum-well channel region 406 may be composed of a material suitable to propagate a wave-function with low resistance. In accordance with an embodiment of the present invention, quantum-well channel region 406 has a lattice constant suitably matched to the lattice constant of the bottom barrier layer of hetero-structure 404, e.g., the lattice constants are similar enough that dislocation formation in quantum-well channel region 406 is negligible. In an embodiment, quantum-well channel region 406 is composed of groups III (e.g. boron, aluminum, gallium or indium) and V (e.g. nitrogen, phosphorous, arsenic or antimony) elements. In one embodiment, quantum-well channel region 406 is composed of InAs or InSb. Quantum-well channel region 406 may have a thickness suitable to propagate a substantial portion of a wave-function, e.g. suitable to inhibit a significant portion of the wave-function from entering the bottom barrier layer of hetero-structure 404 or a top barrier layer (e.g., barrier layer 412) formed on quantum-well channel region 406. In an embodiment, quantum-well channel region 406 has a thickness approximately in the range of 150-200 nanometers. In an alternative embodiment, quantum-well channel region 406 is composed of a semiconductor material such as, but not limited to, a silicon-germanium semiconductor material or a II-VI semiconductor material. In another alternative embodiment, quantum-well channel region 406 is a strained quantum-well region having a thickness approximately in the range of 50-100 Angstroms.

Figure 4B:
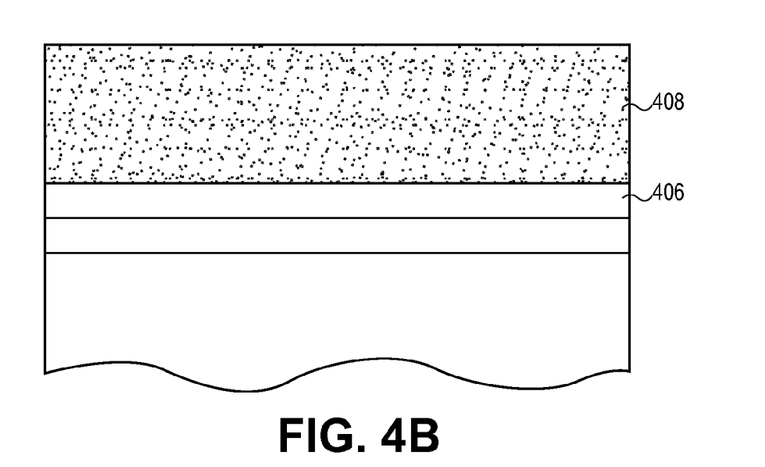
FIG. 4B illustrates a cross-sectional view representing an operation in the fabrication of a quantum-well-based semiconductor device, in accordance with an embodiment of the present invention.

Referring to operation 304 of Flowchart 300 and corresponding FIG. 4B, a method of forming a quantum-well-based semiconductor device includes forming a source and drain material region 408 above quantum-well channel region 406. In accordance with an embodiment of the present invention, quantum-well channel region 406 includes a group III-V material, and forming source and drain material region 408 includes forming a doped group III-V material region. In one embodiment, forming quantum-well channel region 406 includes depositing a material composition by molecular-beam epitaxy.

Figure 4C:
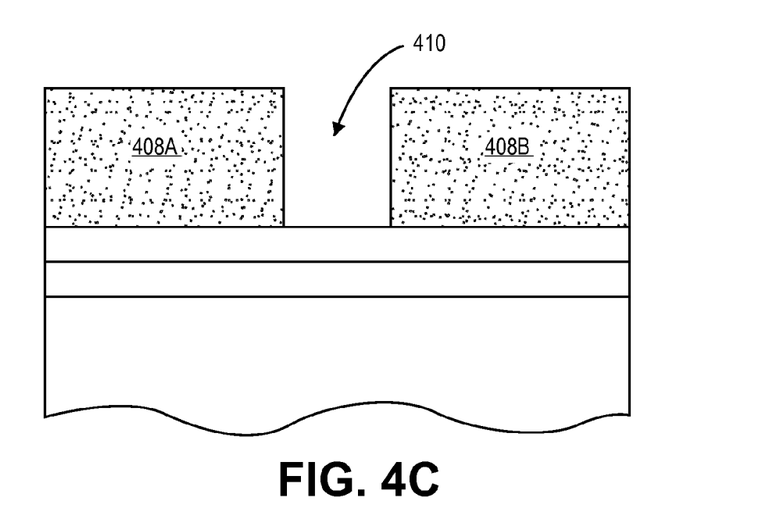
FIG. 4C illustrates a cross-sectional view representing an operation in the fabrication of a quantum-well-based semiconductor device, in accordance with an embodiment of the present invention.

Referring to operation 306 of Flowchart 300 and corresponding FIG. 4C, a method of forming a quantum-well-based semiconductor device includes forming a trench 410 in source and drain material region 408 to provide a source region 408A separated from a drain region 408B. In accordance with an embodiment of the present invention, trench 410 is formed by a dry or wet etch process and the top surface of quantum-well channel region 406 acts as an etch stop, as depicted in FIG. 4C. In accordance with an alternative embodiment of the present invention, trench 410 is formed by a dry or wet etch process and the top surface of a barrier layer acts as an etch stop. In accordance with another alternative embodiment of the present invention, trench 410 is formed by a dry or wet etch process which is halted prior to completely etching through source and drain material region 408.

Figure 4D:
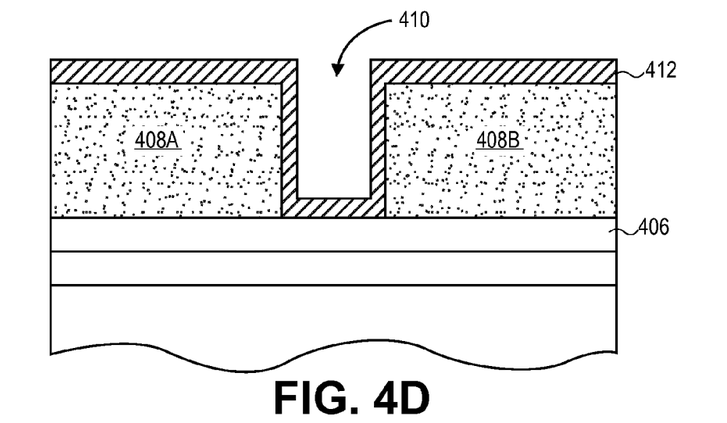
FIG. 4D illustrates a cross-sectional view representing an operation in the fabrication of a quantum-well-based semiconductor device, in accordance with an embodiment of the present invention.

Referring to FIG. 4D, a method of forming a quantum-well-based semiconductor device includes forming a barrier layer 412. In accordance with an embodiment of the present invention, prior to forming gate dielectric layer 414, barrier layer 412 is formed in trench 410, as depicted in FIG. 4D. In one embodiment, forming trench 410 includes exposing the top surface of quantum-well channel region 406 (as depicted in FIG. 4C), and forming barrier layer 412 includes forming barrier layer 412 directly on the exposed surface of quantum-well channel region 406 (as depicted in FIG. 4D). In another embodiment, forming source and drain material region 408 includes forming source and drain material region 408 directly on quantum-well channel region 406 (as shown in FIG. 4B), forming trench 410 includes etching only partially into source and drain material region 408 to leave a portion of source and drain material region 408 at the bottom of trench 410 (not shown), and forming barrier layer 412 includes forming barrier layer 412 directly on the portion of source and drain material region 408 at the bottom of trench 410 (not shown). In an embodiment, prior to forming barrier layer 412, source and drain material region 408 is heated to a temperature approximately at, or above, 550 degrees Celsius.

In accordance with an alternative embodiment of the present invention, prior to forming source and drain material region 408, barrier layer 412 is formed directly on quantum-well channel region 406 (not shown). In one embodiment, forming trench 410 includes exposing the top surface of barrier layer 412, and forming gate dielectric layer 414 includes forming gate dielectric layer 414 directly on the exposed surface of barrier layer 414. In another embodiment, forming source and drain material region 408 includes forming source and drain material region 408 directly on barrier layer 412, forming trench 410 includes etching only partially into source and drain material region 408 to leave a portion of source and drain material region 408 at the bottom of trench 410, and forming gate dielectric layer 414 includes forming the gate dielectric layer 414 directly on the portion of source and drain material region 408 at the bottom of trench 410.

Barrier layer 412 may be composed of a material suitable to confine a wave-function in a quantum-well formed thereunder. In accordance with an embodiment of the present invention, barrier layer 412 has a lattice constant suitably matched to the lattice constant of quantum-well channel region 406, e.g., the lattice constants are similar enough that dislocation formation in barrier layer 412 is negligible. In one embodiment, barrier layer 412 is composed of a layer of material such as, but not limited to, indium phosphide (InP), gallium nitride (GaN), or indium gallium phosphide (InGaP). In accordance with an embodiment of the present invention, forming barrier layer 412 includes forming, by atomic layer deposition, a layer of material such as, but not limited to, indium phosphide (InP), gallium nitride (GaN), or indium gallium phosphide (InGaP). In one embodiment, barrier layer 412 has a thickness approximately in the range of 1-3 nanometers.

Figure 4E:
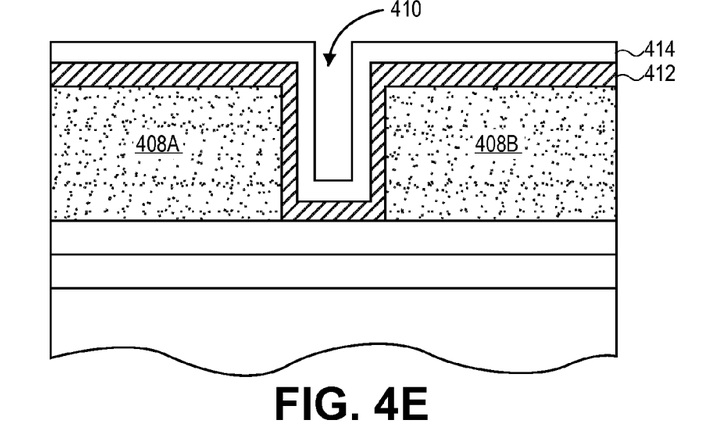
FIG. 4E illustrates a cross-sectional view representing an operation in the fabrication of a quantum-well-based semiconductor device, in accordance with an embodiment of the present invention.

Referring to operation 308 of Flowchart 300 and corresponding FIG. 4E, a method of forming a quantum-well-based semiconductor device includes forming a gate dielectric layer 414 in trench 410, between the source and drain regions 408A and 408B. In accordance with an embodiment of the present invention, gate dielectric layer 414 is composed of a high-K material such as, but not limited to, aluminum oxide ($Al_2O_3$) or hafnium oxide ($HfO_2$).

Figure 4F:
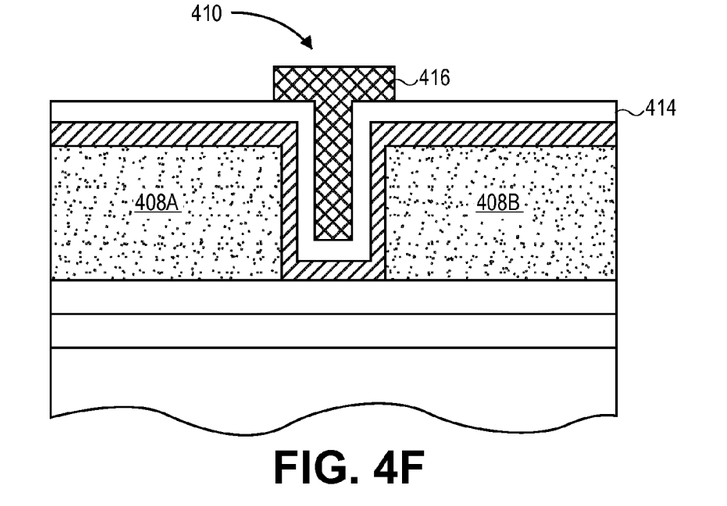
FIG. 4F illustrates a cross-sectional view representing an operation in the fabrication of a quantum-well-based semiconductor device, in accordance with an embodiment of the present invention.

Referring to operation 310 of Flowchart 300 and corresponding FIG. 4F, a method of forming a quantum-well-based semiconductor device includes forming a gate electrode 416 in trench 410, above gate dielectric layer 414. In accordance with an embodiment of the present invention, gate electrode 416 is a metal gate electrode. In one embodiment, gate electrode 416 is composed of a material such as, but not limited to, a metal nitride, a metal carbide, a metal silicide, hafnium, zirconium, titanium, tantalum, aluminum, ruthenium, palladium, platinum, cobalt or nickel.

Thus, quantum-well-based semiconductor devices and methods of forming quantum-well-based semiconductor devices have been disclosed. In accordance with an embodiment of the present invention, a method includes providing a hetero-structure disposed above a substrate and including a quantum-well channel region. A source and drain material region is formed above the quantum-well channel region. A trench is formed in the source and drain material region to provide a source region separated from a drain region. A gate dielectric layer is formed in the trench, between the source and drain regions. A gate electrode is formed in the trench, above the gate dielectric layer. In one embodiment, the method further includes, prior to forming the gate dielectric layer, forming a barrier layer in the trench. In a specific embodiment, the method further includes prior to forming the barrier layer, heating the source and drain material region to a temperature approximately at, or above, 550 degrees Celsius. In another specific embodiment, forming the barrier layer includes forming, by atomic layer deposition, a layer of material such as, but not limited to, indium phosphide (InP), gallium nitride (GaN), or indium gallium phosphide (InGaP). In one embodiment, the method further includes, prior to forming the source and drain material region, forming a barrier layer directly on the quantum-well channel region.

What is claimed is:

1. A quantum-well-based semiconductor device, comprising:
   a hetero-structure disposed above a substrate and comprising a quantum-well channel region;
   a barrier layer disposed directly on the quantum-well channel region;
   a source and drain material region disposed directly on the barrier layer;
   a trench disposed in the source and drain material region separating a source region from a drain region, wherein the trench is disposed only partially into the source and drain material region leaving a portion of the source and drain material region at a bottom of the trench;
   a gate dielectric layer disposed in the trench directly on the portion of the source and drain material region at the bottom of the trench, between the source and drain regions; and
   a gate electrode disposed in the trench, above the gate dielectric layer.

2. The quantum-well-based semiconductor device of claim 1, wherein the barrier layer comprises a layer of material selected from the group consisting of indium phosphide (InP), gallium nitride (GaN), and indium gallium phosphide (InGaP).

3. The quantum-well-based semiconductor device of claim 1, wherein the quantum-well channel region comprises a group III-V material, and wherein the source and drain material region comprises a doped group III-V material region.

4. The quantum-well-based semiconductor device of claim 1, wherein the gate dielectric layer is a high-K material selected from the group consisting of aluminum oxide ($Al_2O_3$) and hafnium oxide ($HfO_2$).

5. The quantum-well-based semiconductor device of claim 1, wherein the dielectric layer is further formed along sidewalls of the trench.

6. The quantum-well-based semiconductor device of claim 1, wherein the gate electrode is a metal gate electrode.

7. The quantum-well-based semiconductor device of claim 1, wherein the gate dielectric layer is a high-K material selected from the group consisting of aluminum oxide ($Al_2O_3$) and hafnium oxide ($HfO_2$), and the gate electrode is a metal gate electrode.

8. The quantum-well-based semiconductor device of claim 1, wherein the quantum-well channel region comprises a material suitable to propagate a wave-function with low resistance.

9. The quantum-well-based semiconductor device of claim 8, wherein the barrier layer comprises a material suitable to confine the wave-function in the quantum-well channel region.

* * * * *